United States Patent [19]
Lampe et al.

[11] Patent Number: 5,852,772
[45] Date of Patent: Dec. 22, 1998

[54] RECEIVER IF SYSTEM WITH ACTIVE FILTERS

[75] Inventors: Ross W. Lampe; John T. Gillette, both of Raleigh; Rodney A. Dolman, Cary; Antonio Montalvo, Raleigh, all of N.C.

[73] Assignee: Ericsson Inc., Research Triangle Park, N.C.

[21] Appl. No.: 804,671

[22] Filed: Feb. 25, 1997

[51] Int. Cl.$^6$ ....................................................... H04B 1/26
[52] U.S. Cl. ................................... 455/226.2; 455/234.1; 455/302; 455/307
[58] Field of Search .............................. 455/226.1, 226.2, 455/226.4, 232.1, 234.1, 234.2, 250.1, 254, 296, 302, 303, 304, 307, 308, 313, 314, 339, 341, 342; 327/350

[56] References Cited

U.S. PATENT DOCUMENTS

| | | |
|---|---|---|
| 4,186,351 | 1/1980 | Thro ........................................ 455/254 |
| 4,531,235 | 7/1985 | Brusen ................................... 455/226.2 |
| 4,619,002 | 10/1986 | Brefini .................................. 455/226.2 |
| 5,241,702 | 8/1993 | Dent . | |
| 5,361,404 | 11/1994 | Dent . | |

OTHER PUBLICATIONS

Tsividis, "Integrated Continuous–Time Filter Design– An Overview," *IEEE Journal of Solid–State Circuits*, vol. 29, No. 3, Mar. 1994, pp. 166–176.
Groenewold, "The Design of High Dynamic Range Continuous–Time Integratable Bandpass Filters," *IEEE Transactions on Circuits and Systems*, vol. 38, No. 8, Aug. 1991, pp. 838–852.

*Primary Examiner*—Thanh Cong Le
*Attorney, Agent, or Firm*—Burns, Doane, Swecker & Mathis, L.L.P.

[57] ABSTRACT

A high dynamic range receiver IF system using limited dynamic range IF filters is disclosed. A variable gain amplifier amplifies a first IF signal. The amplified first IF signal is then applied to an image suppression mixer for suppressing an image component of the amplified first IF signal to provide adequate image suppression for a radio system, wherein the image suppression mixer outputting an image suppressed second IF signal. An active bandpass filter then filters the unwanted components from the second IF signal. The filtered signal is then hard limited in a limiting amplifier which outputs a limited IF signal. A logarithmic detector then provides a received signal strength indicator.

17 Claims, 8 Drawing Sheets

RECEIVER IF SYSTEM WITH ACTIVE FILTERS

FIELD OF THE INVENTION

The present invention relates to a radio receiver integrated intermediate frequency circuit with active bandpass filters.

BACKGROUND OF THE INVENTION

Figure 1:
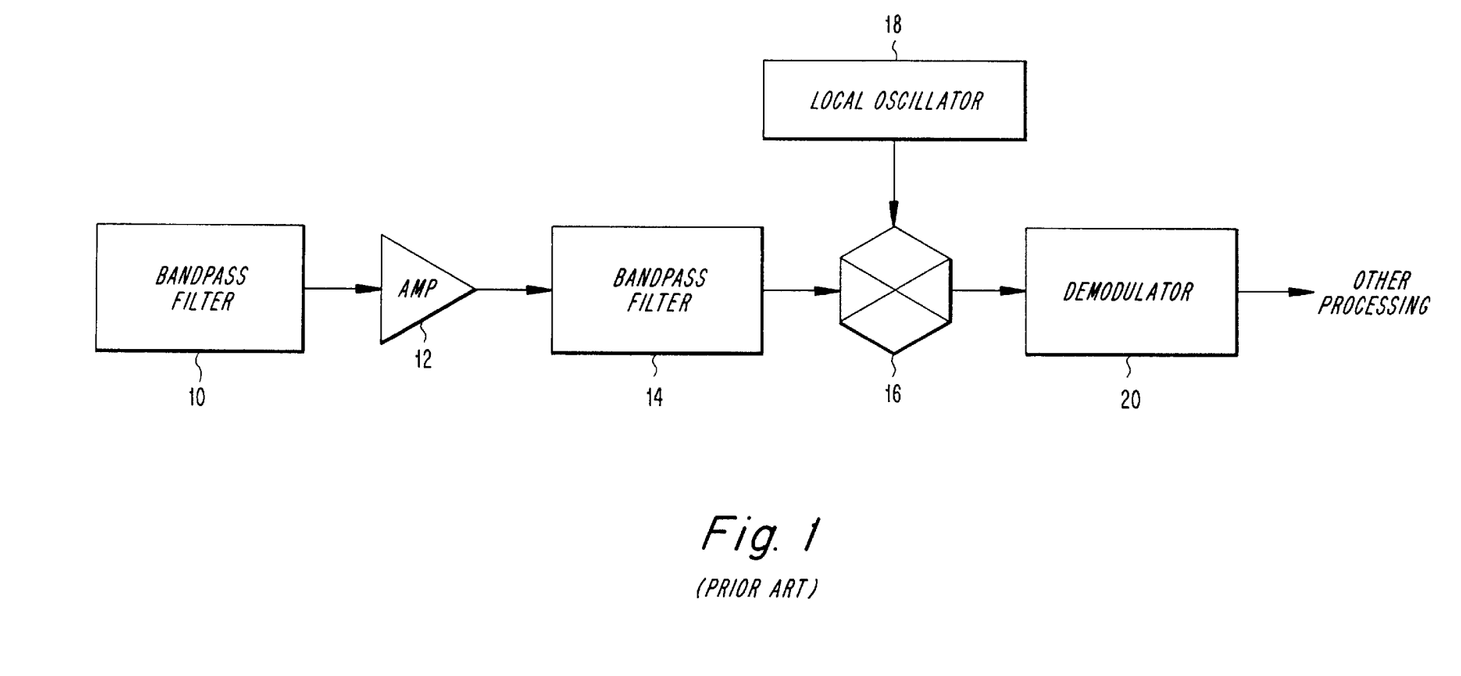
FIG. 1 illustrates a conventional superheterodyne receiver.

In a conventional superheterodyne receiver as illustrated in FIG. 1, a received signal passes through a bandpass filter 10 before it is amplified in an RF amplifier 12. The bandpass filter 10 filters out-of-band signals that may saturate the RF amplifier 12. In other words, the bandpass filter 10 ensures that only the desired signal components are amplified. After amplification, the output signal produced by the amplifier 12 passes through a second bandpass filter 14. The bandpass filter 14 filters out any remaining out-of-band signals that were not completely suppressed by the bandpass filter 10. In addition, the bandpass filter 14 reduces noise and interference at other frequencies to which the mixer may exhibit undesired responses. The output signal from the second bandpass filter 14 is received by a frequency mixer 16. By mixing a signal from a local oscillator 18 with the filter output signal, the mixer 16 converts the received frequency into an intermediate frequency suitable for further conventional receiver processing such as demodulation as indicated by the demodulator 20.

Figure 2:
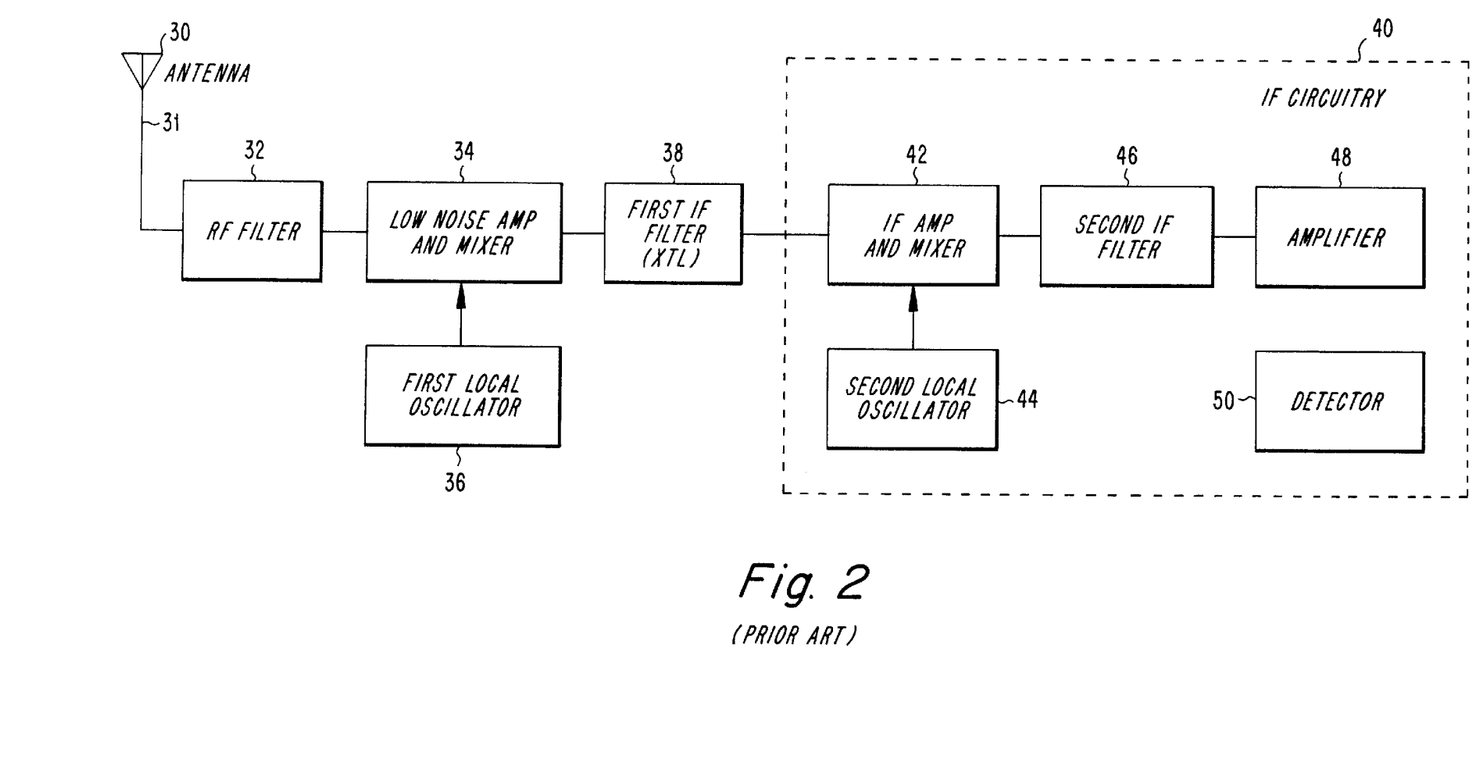
FIG. 2 illustrates a dual down conversion superheterodyne receiver.

Sometimes additional filtering may be required and a dual down conversion superheterodyne receiver may be used. As illustrated in FIG. 2, the dual down conversion superheterodyne receiver 30 receives signals over an antenna 31. The received signal is then filtered in an RF filter 32 and amplified and mixed in a low noise amplifier/mixer 34 with a signal from the first local oscillator 36 as disclosed above with reference to the receiver illustrated in FIG. 1.

The mixed signal is then filtered in the first intermediate frequency (IF) filter 38. In cellular radio applications, the first IF filter is typically a crystal filter. The signal outputted by the first IF filter 38 is then amplified in an IF filter/mixer 42. The amplified signal is then mixed with a signal from a second local oscillator 44. The mixed signal is then filtered in a second IF filter, typically a ceramic filter, and is then outputted to an amplifier 48. Radio designers have in the past tried to lower the cost of receivers by replacing the passive crystal or ceramic IF bandpass filters with active filter circuits.

Figure 3:
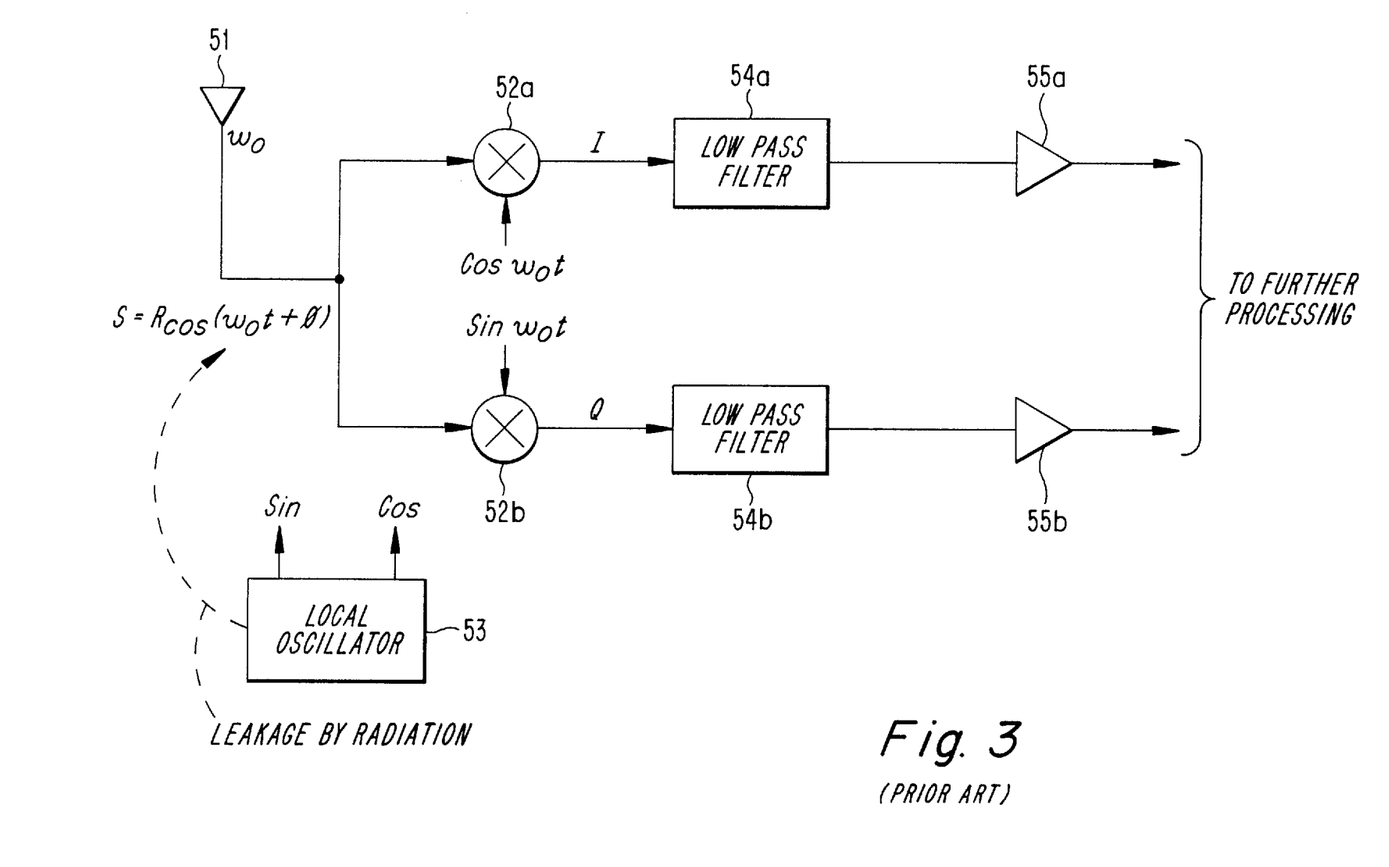
FIG. 3 illustrates a simple block diagram showing a receiver using the zero-IF technique.

One approach to eliminating the IF filter is to employ a quadrature mixer at either the first or second down conversion stage and then merging the signal down to its base band in-phase (I) and quadrature phase (Q) components, which are then low pass filtered. This approach to receiver design is called homodyne or zero-IF. According to theory, an IQ radio receiver can be constructed according to FIG. 3, in which the radio signal 56 from the antenna 51 is applied directly to two balanced, quadrature mixers 52a, 52b where the signal is multiplied respectively by a sine and cosine wave at the carrier frequency of the signal generated by a local oscillator 53. In this manner, the I-channel or in-phase signal and the Q-channel or quadrature signal are generated. The multiplication devices yield outputs containing both sum frequency components around 2f and difference frequency components around zero frequency. Low pass filters 54a and 54b eliminate the former and accept the latter. The zero frequency components can then be amplified to any convenient level by low-frequency amplifying stages 55a, 55b instead of high frequency amplifiers.

Essentially, the zero-IF receiver eliminates the interim conversion to an intermediate frequency by converting the incoming signal directly to baseband in a single operation. It has the advantage that the low pass filters are often simpler to construct than the bandpass filters they replace. However, in practice, the zero-IF approach is beset with a variety of practical problems, one of which concerns the imperfection of the balanced mixers as compared to perfect mathematical multipliers. The most troublesome aspect of this imperfection is the generation of a DC offset or standing voltage that can be many orders of magnitude greater than the desired signal. The low frequency amplifiers which receive the mixer outputs, can be forced into saturation by the large DC offset long before the desired signal has been amplified sufficiently.

Theoretically, another approach for eliminating the ceramic IF filters is to replace them with active bandpass filter circuits. The active filter circuits could be integrated along with other IF circuits, such as amplifiers, mixers, voltage controlled oscillators (VCO), and detectors to compose an IF system. The main difficulty with active bandpass IF circuits is that they have not been previously realizable with adequate dynamic range. The dynamic range of active filters is restricted at high signal levels due to compression in the circuit and at low signal levels due to noise. The theoretical maximum dynamic range of an active filter is related to its quality factor ($Q_f$) as defined by $$\text{MaxDynamic Range} \leq C_T(V_{RMS})^2/(2 \pi kT\phi Q_F) \qquad (\text{eq. 1})$$

where $C_T$=the total filter capacitance $V_{RMS}$=the maximum RMS input signal voltage kT=Boltzman's constant×temperature $\phi$=a constant dependent upon the circuit devices and topology $Q_F$=the filter quality factor=(center frequency)/(3dB bandwidth)

Close inspection of Equation 1 reveals that $V_{RMS}$ is predetermined since the radio supply voltage is fixed, $2\pi KT$ and $\phi$ are constants for a given operating temperature and device technology, and the total capacitance $C_T$ is restricted by the available die area on the integrated circuit. These considerations leave only the $Q_F$ factor as a variable that can be manipulated to increase the filter's dynamic range.

For a given application, the signal bandwidth is predetermined which implies that the filter's center frequency must be lowered in order to lower the quality factor $Q_F$ and thus increase the filter's dynamic range. However, a problem occurs when the intermediate frequency is lowered in that it moves closer to the frequency of the image and at some point the filters at the previous receiver stages will be unable to reject this image.

SUMMARY OF THE INVENTION

It is an object of the present invention to overcome the deficiencies described above by providing a radio receiver and an integrated IF circuit with active bandpass filters, wherein the quality factor $Q_F$ of the filters is reduced to a realizable level by lowering the intermediate frequency of the operation. Lowering the intermediate frequency reduces the image rejection afforded by the first IF filter. This deficiency is overcome by using an image suppression mixer before the filter.

Despite the increase in dynamic range resulting from the reduced quality factor $Q_F$, active filters cannot achieve the dynamic range that high-performance radios require. The dynamic range can be increased further by dynamically adjusting the gain of the amplifiers ahead of the active filter. That is, if the signals get too large, the gain is reduced.

Most 2-way radio systems require the mobile station to report the received signal strength back to the base station. This is accomplished with a circuit that outputs a voltage proportional to the logarithm of its input voltage. That voltage is typically called the Received Signal Strength Indicator (RSSI). In general, RSSI=K*log (A*Vin) where K is a constant and A is the total gain before the RSSI circuit. Since the gain is being varied to accommodate the limited dynamic range of the active filter, the RSSI is corrupted. This invention includes a means to re-construct the RSSI to make it independent of the varying gain. It is advantageous to select an intermediate frequency that is an even multiple of the signal's channel bandwidth.

BRIEF DESCRIPTION OF THE DRAWINGS

These and other features and advantages of the present invention will be readily apparent to one of ordinary skill in the art from the following written description, read in conjunction with the drawings, in which.

DETAILED DESCRIPTION OF THE PREFERRED EMBODIMENTS

Figure 4:
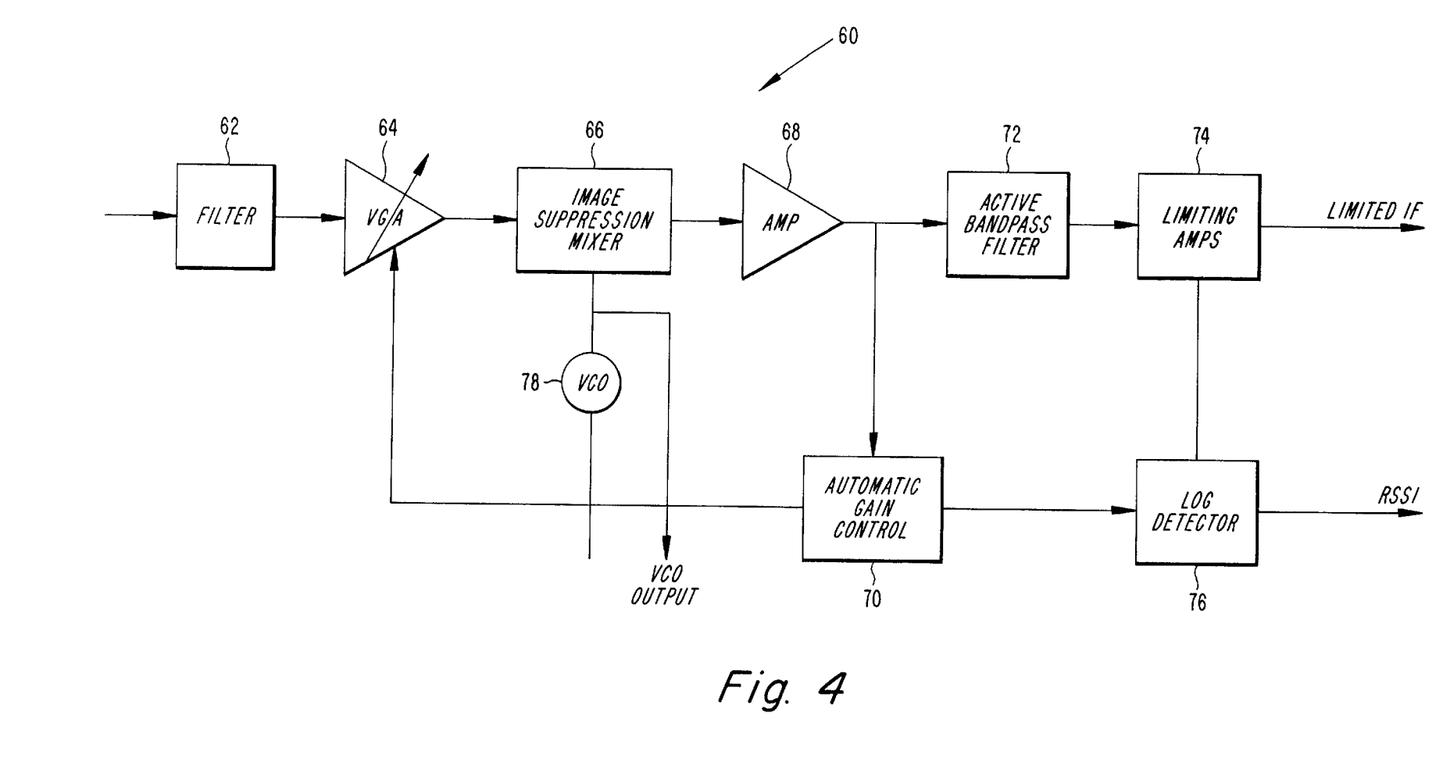
FIG. 4 illustrates an IF integrated circuit with active filters according to one embodiment of the present invention.

FIG. 4 illustrates a schematic block diagram of a system for implementing the present invention. It will be appreciated that while one of the specific applications of the present invention is to cellular mobile radio telephone receivers, the present invention may be used in any signal receiving apparatus.

Figure 5:
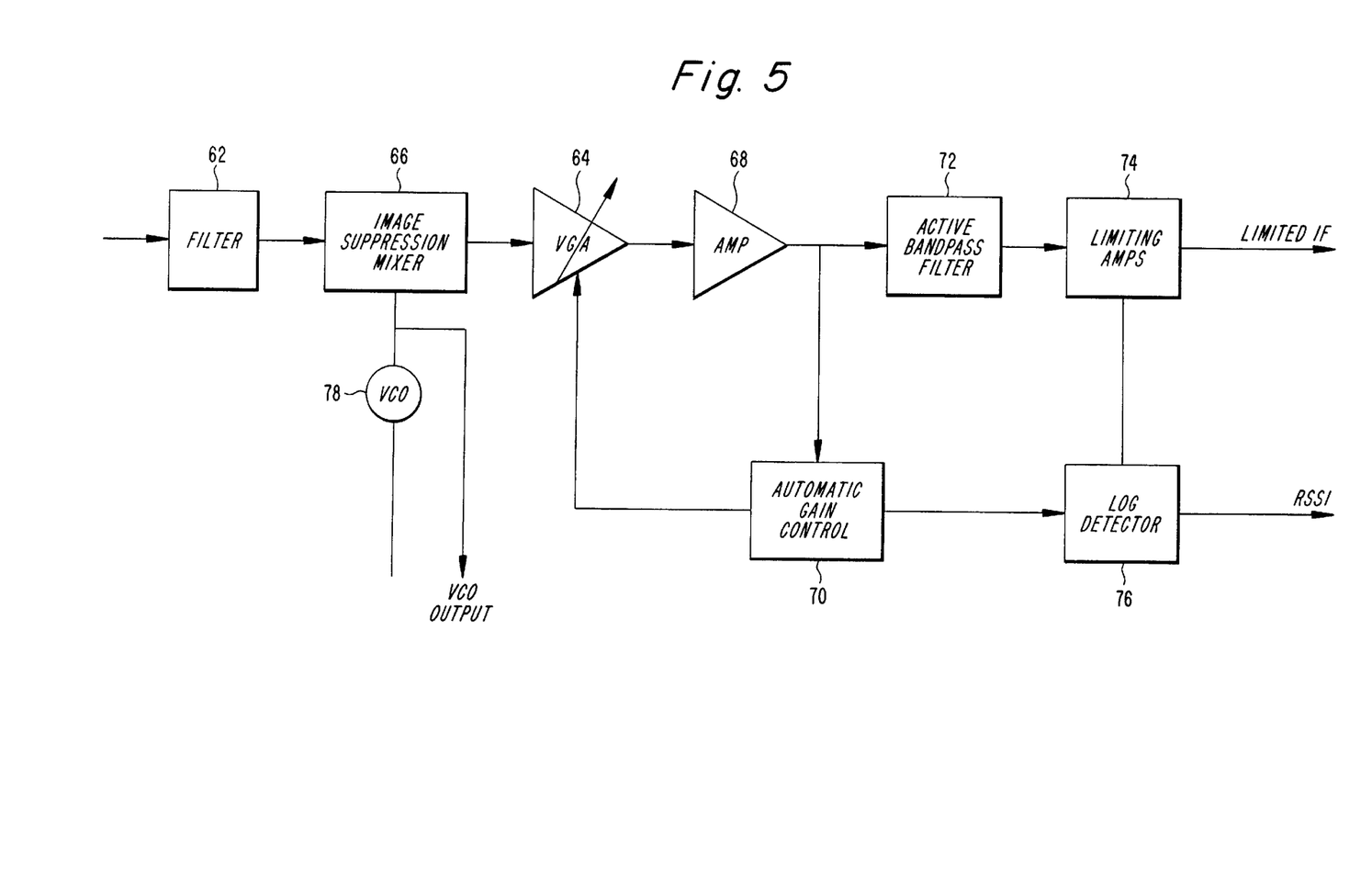
FIG. 5 illustrates an IF integrated circuit with active filters according to another embodiment of the present invention.

The IF integrated circuit 60 illustrated in FIG. 4 receives an input signal from the first IF filter 38 illustrated in FIG. 2. The input signal to the IF integrated circuit 60 is amplified in a variable gain amplifier (VGA) 64 and is then provided to an image suppression mixer 66. Alternatively, the variable gain amplifier could be connected to the output of the image suppression mixer as illustrated in FIG. 5. In the present invention, the intermediate frequency is lowered to reduce the quality factor $Q_F$ of the bandpass filter in order to increase the filter's dynamic range. The image signal is suppressed by the image suppression mixer 66 such that the combination of the first intermediate frequency filter 62 and the image suppression mixer provide adequate image rejection for the radio system. The image suppression mixer 66 outputs a signal to an IF amplifier 68 which amplifies the signal. The variable gain amplifier is controlled by an automatic gain control loop 70 which detects the signal level at the input to the active filter 72 by, for example, an envelope detection circuit or a logarithmic detection circuit and adjusts the gain of the variable gain amplifier accordingly. Furthermore, the variable gain amplifier 64 could instead be controlled digitally using a micro-controller. The dynamic range of the receiver can be increased by reducing the gain of the variable gain amplifier when the detected signal levels are large. The amplified signal is then applied to the active bandpass filter 72 which filters undesired components from the second IF signal.

Figure 6:
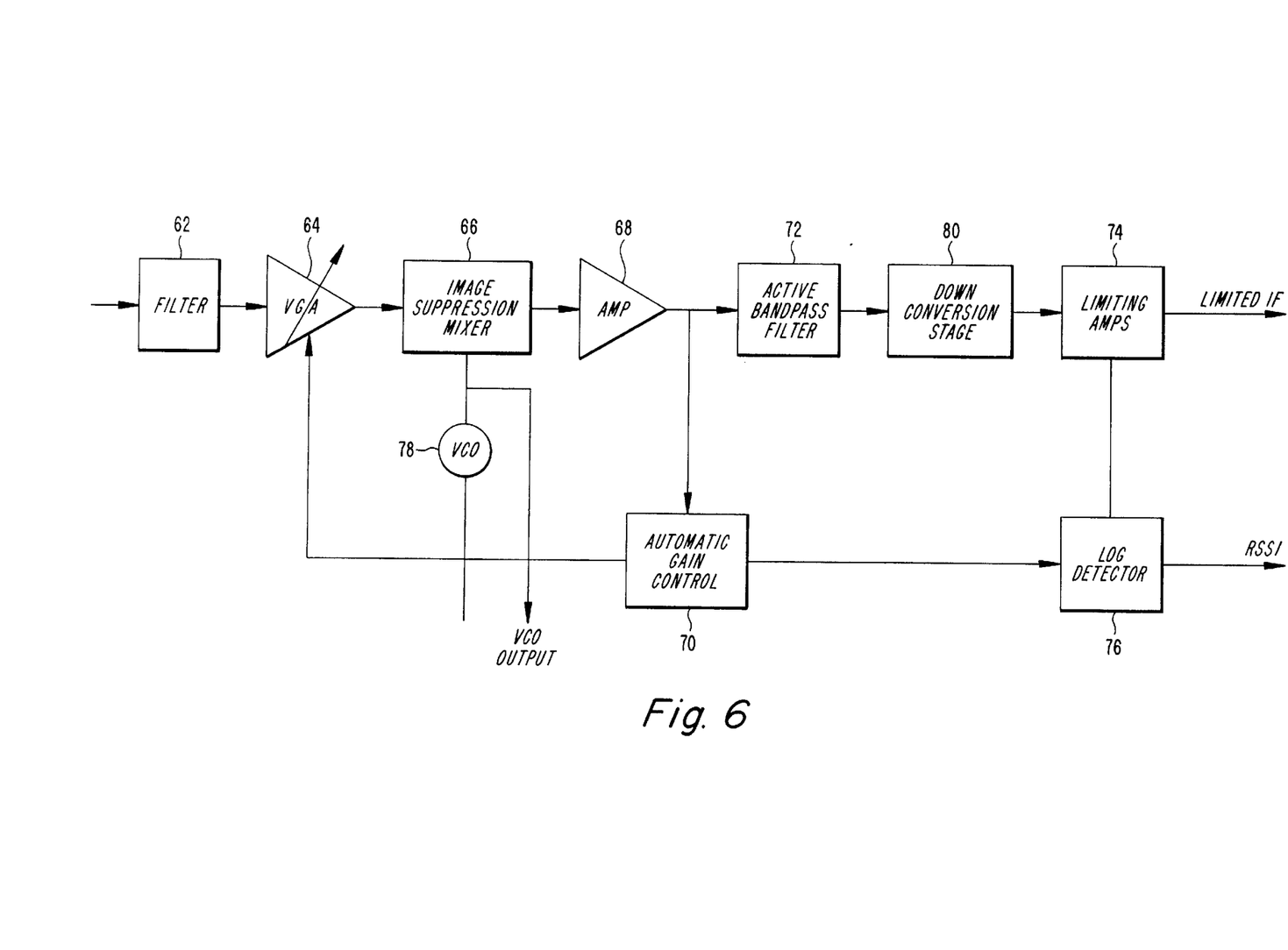
FIG. 6 illustrates an IF integrated circuit with active filters according to another embodiment of the present invention.
Figure 7:
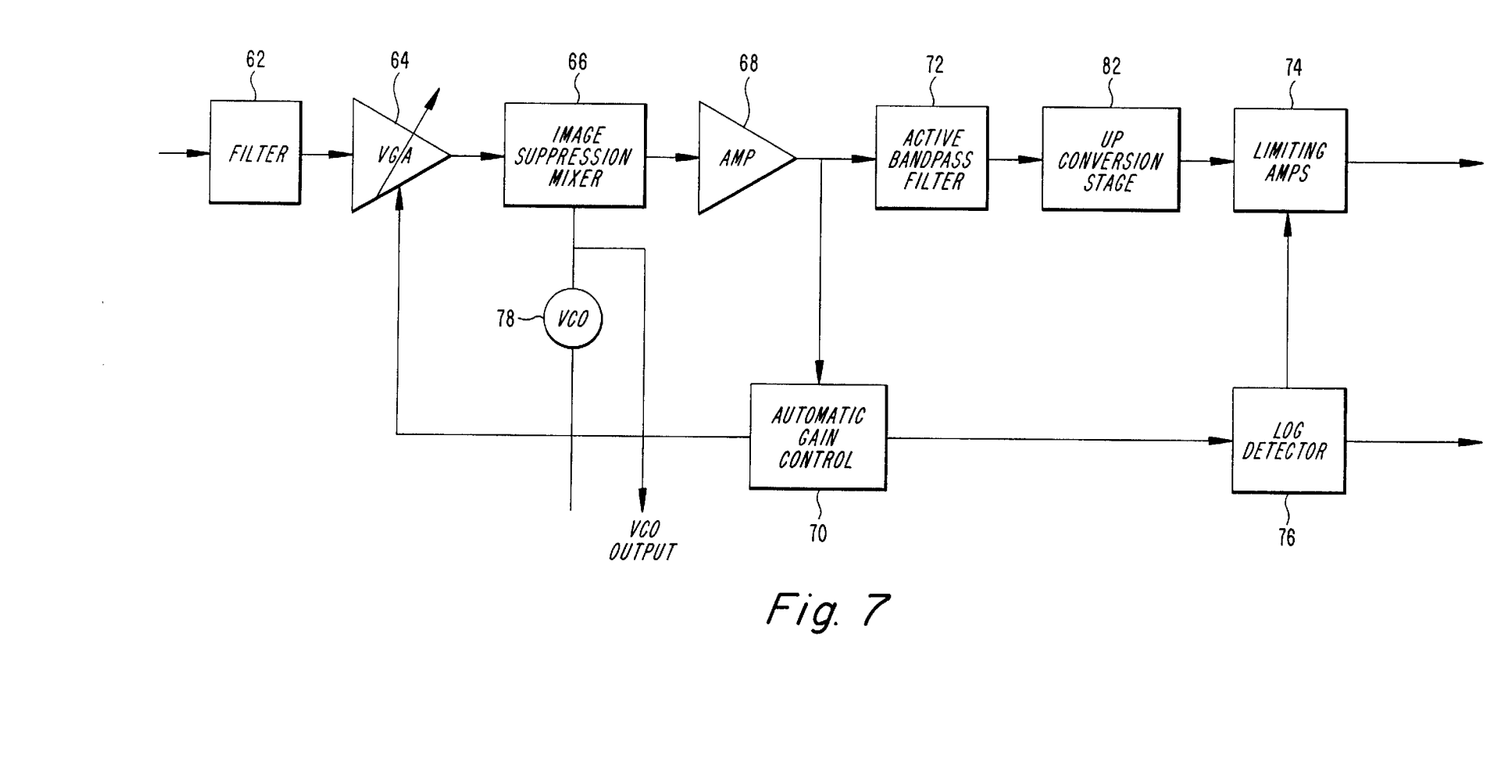
FIG. 7 illustrates an IF integrated circuit with active filters according to another embodiment of the present invention.

The active filter in the IF integrated circuit can then be followed by a limiting amplifier 74 and a logarithmic detector 76 as is normally found in FM radios. The limiting amplifier 74 hard limits the second IF signal before it is sent to a demodulator detector or discriminator, any of which could be integrated into the present IF system. The logarithmic detector 76 outputs an indication of the received signal strength (RSSI). The logarithmic detector includes an input from the AGC circuit such that the logarithm of the gain is subtracted from the RSSI. That is, RSSI=K(log (A*Vin)−log(A))=K*log(Vin) where K is a constant. Furthermore, the active filter could be followed by a down conversion stage 80, as illustrated in FIG. 6, so that the IF circuit could output base band in phase and quadrature phase signals. In addition, the active filter could be followed by an up conversion stage 82, as illustrated in FIG. 7, so that the IF circuit could output another intermediate frequency at a frequency that is more suitable for a specific type of demodulator detector or discriminator circuitry.

According to one embodiment of the present invention, it is preferable to place the second intermediate frequency at an even multiple of the signal's channel bandwidth (e.g., 2×, 4×, . . . ). For example, for cellular radio systems in the United States, the channel bandwidth is 30 kHz. The second intermediate frequency can then be chosen to be 4×30 kHz which equals 120 kHz. The reason for this choice is that the preferred embodiment of the active filter is a balanced or a differential circuit design, which provides good rejection of even ordered distortion components of the signal. Thus, only very low levels of even harmonics of the neighboring channels located at 30 kHz and 60 kHz can fall into the desired channel at 120 kHz.

Another aspect of the preferred embodiment is setting the second local oscillator at a frequency which is lower than the first intermediate frequency, called low side injection, which implies that the second intermediate frequency will be the upper side band and the image suppression mixer 66 will reject the lower image. This is an important choice in making this IF system work, since the image suppression mixer will not by itself provide adequate rejection of the image frequency, and some additional rejection is required from the first intermediate frequency crystal filter. By their design and construction, crystal filters have very good rejection on the low side of the pass band, but poor rejection on the high side. Therefore, this combination of crystal filter, image suppression mixer and the low second intermediate frequency needs low side local oscillator injection for adequate image rejection.

Figure 8:
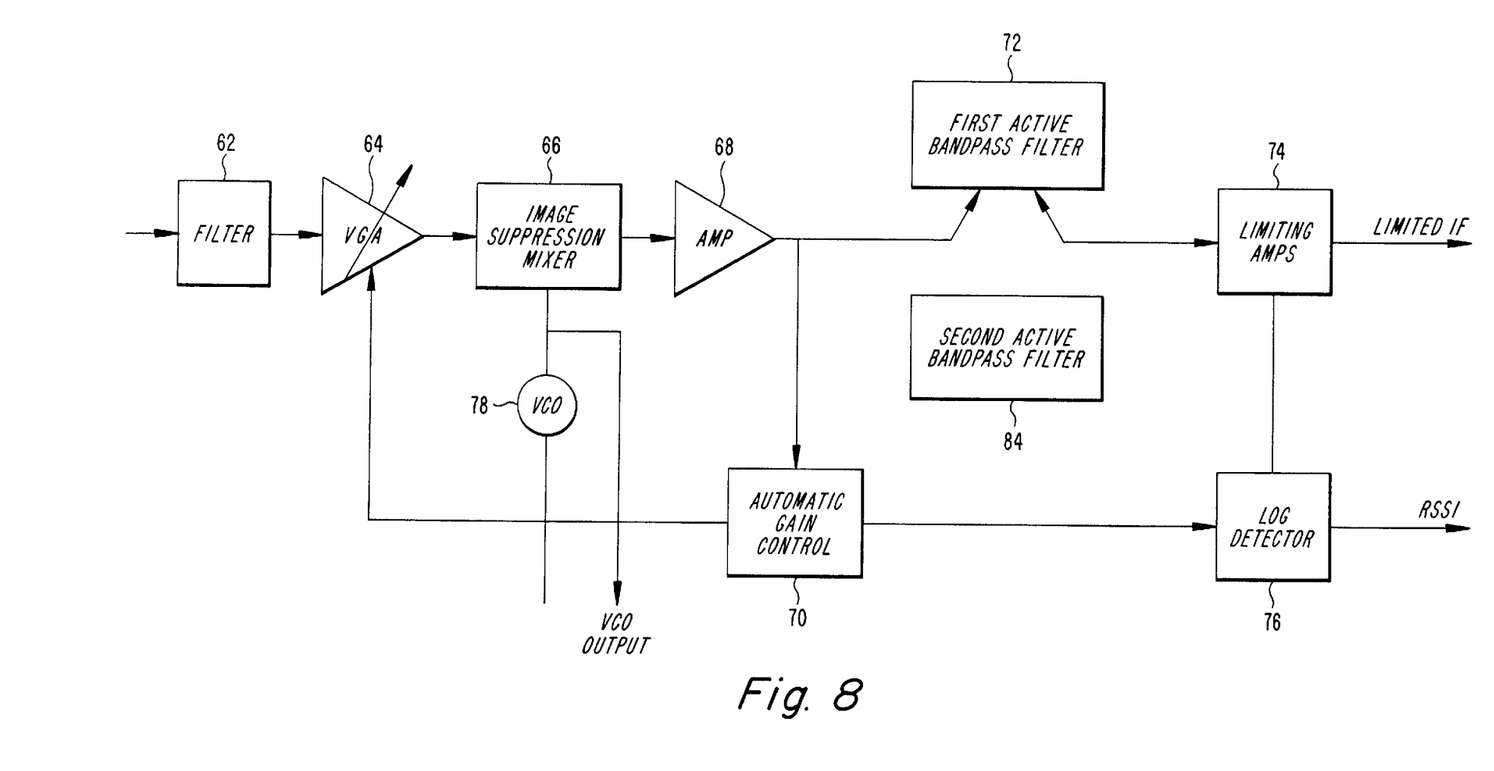
FIG. 8 illustrates a dual band IF integrated circuit with active filters according to another embodiment of the present invention.

According to another embodiment of the present invention, the possibility to support dual bandwidth operation in a receiver incorporating the present IF system is disclosed. The IF system can contain an integrated voltage control oscillator (VCO) as illustrated in FIGS. 4–8. If the VCO 78 is phase locked by a programmable synthesizer, then the second intermediate frequency can be programmable. In addition, a second active bandpass filter 84 can be added to the IF system, as illustrated in FIG. 8, so that for one signal bandwidth one of the filters can be used and for another signal bandwidth, possibly centered around another intermediate frequency, the other filter can be switched into the signal path. An application of this dual bandwidth operation is a radio using both 800 MHz cellular and 1900 MHz PCS bands, where the channel bandwidth in the cellular band is 30 kHz and the channel bandwidth at the 1900 MHz band can be much wider to support a GSM type system operation or code division multiple access. For example, setting the intermediate frequency at 120 kHz for the cellular band results in an active filter quality factor of 4. If the radio were to also support GSM which has a channel bandwidth of 200 kHz, the intermediate frequency could be reconfigured to 800 kHz and the quality factor of the GSM filter would also then be 4.

The present invention has been described in terms of specific embodiments to facilitate understanding. The above embodiments, however, are illustrative rather than restrictive. It will be readily departures one of ordinary skill in the art that departures may be made from the specific embodiments shown above without departing from the central spirit and scope of the invention. Therefore, the invention should not be regarded as being limited to the above examples, but should be regarded instead as being fully commiserate in scope with the following claims.

What is claimed is:

1. A high dynamic range receiver IF system using limited dynamic range IF filters, comprising:

a variable gain amplifier for amplifying a first IF signal;

an image suppression mixer for suppressing an image component of the amplified first IF signal to provide adequate image suppression for a radio system, said image suppression mixer outputting an image suppressed second IF signal;

first active bandpass filter means for filtering the unwanted components from the second IF signal;

limiting amplifier means for hard limiting the filtered signal and outputting a limited IF signal; and a logarithmic detector means for providing a received signal strength indicator.

2. A receiver IF system according to claim 1, wherein the variable gain amplifier is controlled by an automatic gain control loop.

3. A receiver IF system according to claim 1, wherein the variable gain amplifier is controlled digitally by a microcontroller.

4. A receiver IF system according to claim 1, wherein the logarithmic detector means includes a means to eliminate the effect of gain variations such that the received signal strength indicator is un-corrupted by the varying gain of the variable gain amplifier.

5. A receiver IF system according to claim 1, further comprising:

a down conversion stage for converting the second IF signal to base band in-phase signals and quadrature phase signals.

6. A receiver IF system according to claim 1, further comprising:

an up conversion stage for converting the second IF signal to another frequency.

7. A receiver IF system according to claim 1, further comprising:

a voltage controlled oscillator for providing an adjustable frequency signal to said image suppression mixer which mixes the adjustable frequency signal with the first IF signal so as to change the frequency of the first IF signal.

8. A receiver IF system according to claim 1, further comprising;

a second active bandpass filter means centered around a second intermediate frequency; and switching means for selectively connecting said first and second active bandpass filter means to said amplifier and said logarithmic detector means.

9. A high dynamic range receiver IF system using limited dynamic range IF filters, comprising:

an image suppression mixer for suppressing an image component of a first IF signal to provide adequate image suppression for a radio system, said image suppression mixer outputting an image suppressed second IF signal;

a variable gain amplifier for amplifying said second IF signal;

first active bandpass filter means for filtering undesired components from the second IF signal;

limiting amplifier means for hard limiting the second IF signal and outputting a limited IF signal; and a logarithmic detector means for providing a received signal strength indicator from said filtered signal.

10. A receiver IF system according to claim 9, wherein the variable gain amplifier is controlled by an automatic gain control loop.

11. A receiver IF system according to claim 9, wherein the variable gain amplifier is controlled digitally by a microcontroller.

12. A receiver IF system according to claim 9, wherein the logarithmic detector means includes a means to eliminate the effect of gain variations such that the received signal strength indicator is un-corrupted by the varying gain of the variable gain amplifier.

13. A receiver IF system according to claim 9, further comprising:

a down conversion stage for converting the second IF signal to base band in-phase signals and quadrature phase signals.

14. A receiver IF system according to claim 9, further comprising:

an up conversion stage for converting the second IF signal to another frequency.

15. A receiver IF system according to claim 9, further comprising:

a voltage controlled oscillator for providing an adjustable frequency signal to said image suppression mixer which mixes the adjustable frequency signal with the first IF signal so as to change the frequency of the first IF signal.

16. A receiver IF system according to claim 9, wherein said first active bandpass filter means is centered around a first intermediate frequency.

17. A receiver IF system according to claim 16, further comprising:

a second active bandpass filter means centered around a second intermediate frequency; and switching means for selectively connecting said first and second active bandpass filter means to said variable gain amplifier and said logarithmic detector means.

* * * * *

UNITED STATES PATENT AND TRADEMARK OFFICE
CERTIFICATE OF CORRECTION

PATENT NO. : 5,852,772
DATED : December 22, 1998
INVENTOR(S) : Ross W. LAMPE et al.

It is certified that error appears in the above-identified patent and that said Letters Patent is hereby corrected as shown below:

Column 5, Line 21, change "departures" to --apparent to--.

Signed and Sealed this

Third Day of October, 2000

Attest:

Q. TODD DICKINSON

*Attesting Officer*  *Director of Patents and Trademarks*